United States Patent
Liu

(10) Patent No.: US 10,600,948 B1
(45) Date of Patent: Mar. 24, 2020

(54) PACKAGE WITH THERMOELECTRIC POWER FEEDBACK LOOP

(71) Applicant: Intel Corporation, Santa Clara, CA (US)

(72) Inventor: Hui Liu, Dublin, CA (US)

(73) Assignee: Intel Corporation, Santa Clara, CA (US)

( * ) Notice: Subject to any disclaimer, the term of this patent is extended or adjusted under 35 U.S.C. 154(b) by 190 days.

(21) Appl. No.: 15/362,508

(22) Filed: Nov. 28, 2016

(51) Int. Cl.
*H01L 35/32* (2006.01)
*H01L 25/18* (2006.01)
*H01L 23/367* (2006.01)
*H01L 23/498* (2006.01)
*H01L 35/00* (2006.01)
*H01L 35/30* (2006.01)

(52) U.S. Cl.
CPC .......... *H01L 35/32* (2013.01); *H01L 23/3672* (2013.01); *H01L 23/49816* (2013.01); *H01L 25/18* (2013.01); *H01L 35/00* (2013.01); *H01L 35/30* (2013.01)

(58) Field of Classification Search
CPC ......... H01L 35/00; H01L 35/30; H01L 35/32; H01L 35/34; H01L 23/49816; H01L 23/3672; H01L 25/18
See application file for complete search history.

(56) References Cited

U.S. PATENT DOCUMENTS

| 6,559,538 B1 | 5/2003 | Pomerene et al. | |
| 2006/0102223 A1* | 5/2006 | Chen | H01L 23/38 136/201 |
| 2008/0178920 A1* | 7/2008 | Ullo | E21B 47/011 136/204 |
| 2014/0252531 A1* | 9/2014 | Aryan | H01L 35/32 257/467 |
| 2016/0343929 A1* | 11/2016 | Yu | H01L 23/49811 |

OTHER PUBLICATIONS

Ali Shakouri et al., on-chip solid-state cooling for integrated circuits using thin-film microrefrigerators, University of California postprints, IEEE Transactions on components and packaging technologies, vol. 28, No. 1, Mar. 2005.
C. H. Lin et al., System power integrity impact by package power/ground balls assignment, Progress in electromaganetics research symposi, proceedings, KL, Malaysia, Mar. 27-30, 2012, Piers proceedings, kuala lumpur.
Hossain Fahad et al., Thermoelectricity from wasted heat of integrated circuits, Appl nanosci (2013) 175-178.
Prof, Dr. Yehea Ismail et al., Thermoelectric Devices, Cooling and power generation, center of nanoelectronics and devices, the American university in cairo, cairo, Egypt.

* cited by examiner

Primary Examiner — Matthew T Martin
(74) Attorney, Agent, or Firm — Fletcher Yoder, P.C.

(57) ABSTRACT

A system includes an electronic device comprising one or more integrated circuit (IC) packages. The one or more IC packages include one or more IC chips and one or more thermoelectric power feedback systems. The one or more thermoelectric power feedback systems include one or more thermoelectric devices coupled to the one or more IC chips to generate power based on heat produced by the one or more IC chips. The one or more thermoelectric power feedback systems also include a power routing system that supplies the generated power to the one or more IC packages.

19 Claims, 3 Drawing Sheets

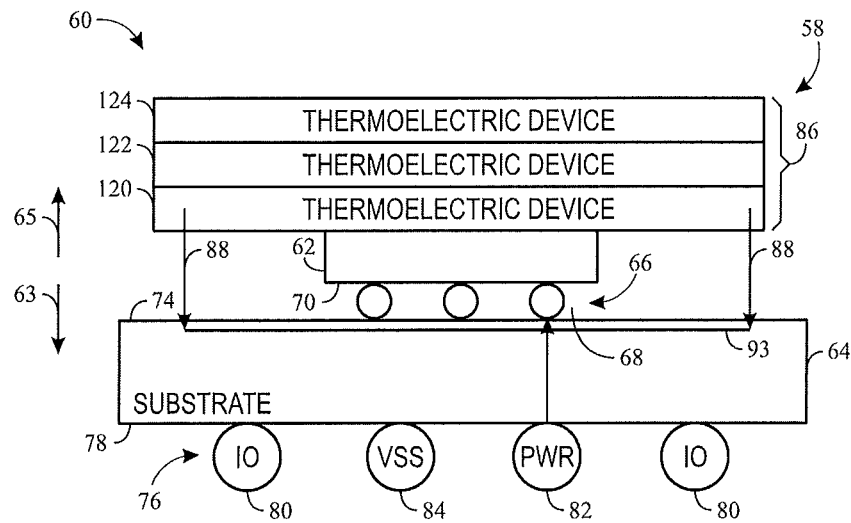
*FIG. 6*
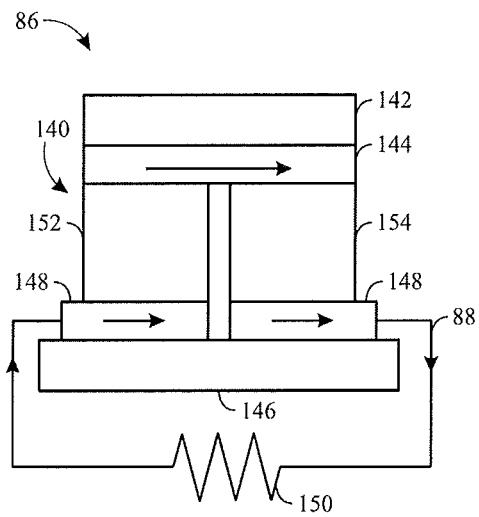
*FIG. 7*
| FPGA POWER | CONVERSION EFFICIENCY | RECYCLED POWER | CORE (LE) POWER | NEW CORE POWER | POWER BOOST | POWER BALL SAVING |
|---|---|---|---|---|---|---|
| 200W | 10% | 20W | 100W | 120W | 20% | ~ 30 |
*FIG. 8*

PACKAGE WITH THERMOELECTRIC POWER FEEDBACK LOOP

BACKGROUND

The present disclosure relates generally to powering integrated circuits. More particularly, the present disclosure relates to a thermoelectric power feedback system implemented in packaging for integrated circuits.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Integrated circuits (ICs) are a keystone of modern electronics. An integrated circuit (IC) package encapsulates IC chips or die and provides electrical connection from the IC chips to external electrical connections such as a printed circuit board (PCB). Electronic devices from small handheld devices to desktop systems to large servers may include one or more IC packages to perform a wide range of applications. An IC package may include power balls and ground balls for providing electrical paths and grounds to supply power from the PCB to the IC chips, and it may include input/output (I/O) balls for routing I/O signals. To provide higher computing capability and feature utilization, both power supply to the IC chip and I/O routing need to be enhanced. One possible approach to achieve such goal is by increasing the size of the IC package as to add a greater number of power, ground, and I/O balls to enhance power supply and I/O routing. However, increasing the IC package size may add cost to IC package fabrication and at times may not be an option in space-constrained applications. Alternatively, if the IC package size remains unchanged, adding a greater number of power and ground balls needs to be compensated by reducing the number of I/O balls. However, a reduction in the number of I/O balls may adversely impact computing capability and feature utilization of the electronic devices.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Present embodiments relate to a thermoelectric power feedback system implemented in IC package(s) in an electronic device. The thermoelectric power feedback system may generate additional electrical power by converting heat generated by an IC chip to power that may be fed back to the chip. As such, the thermoelectric power feedback system may enhance power support and feature utilization of the electronic device without increasing the size of IC package (s). In addition, the thermoelectric power feedback system may aid in thermal management of the electronic device as it recycles waste heat from the IC chips.

In one embodiment, a system includes an electronic device comprising one or more integrated circuit (IC) packages. The one or more IC packages include one or more IC chips and one or more thermoelectric power feedback systems. The one or more thermoelectric power feedback systems include one or more thermoelectric devices coupled to the one or more IC chips to generate power based on heat produced by the one or more IC chips. The one or more thermoelectric power feedback systems also include a power routing system that supplies the generated power to the one or more IC packages.

In another embodiment, an integrated circuit (IC) package includes one or more IC chips and one or more thermoelectric power feedback systems. The one or more thermoelectric power feedback systems include one or more thermoelectric devices coupled to the one or more IC chips to generate power based on heat generated by the one or more IC chips. The one or more thermoelectric power feedback systems also include a power routing system that supplies the generated power to the one or more IC packages.

In another embodiment, an integrated circuit (IC) package includes one or more IC chips. The IC package includes a first number of power balls, a second number of ground balls, and a third number of input/output (I/O) balls that provide electrical connection between the one or more IC chips and a printed circuit board of an electronic device. The IC package also includes one or more a thermoelectric power feedback systems that generate and supply additional energy to the IC package. The one or more thermoelectric power feedback systems include one or more thermoelectric devices coupled to the one or more IC chips to generate electrical power based on heat produced by the one or more IC chips. The one or more thermoelectric power feedback systems also include a power routing system that couples the one or more thermoelectric devices to a power grid of the IC package.

Various refinements of the features noted above may be employed in relation to various aspects of the present disclosure. Further features may also be incorporated in these various aspects as well. These refinements and additional features may be employed individually or in any combination. For instance, various features discussed below in relation to one or more of the illustrated embodiments may be incorporated into any of the above-described aspects of the present invention alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Advantages of the present disclosure may become apparent upon reading the following detailed description and upon reference to the drawings in which:

FIG. 6 is a schematic diagram of an integrated circuit (IC) package of the electronic device of FIG. 1 illustrating the thermoelectric power feedback system implemented in the IC package, wherein a plurality of thermoelectric devices are used to enhance power generation, in accordance with an embodiment;

FIG. 7 is a schematic diagram of an thermoelectric device of the thermoelectric power feedback system illustrating a power generation mechanism, in accordance with an embodiment; and FIG. 8 is a table illustrating enhanced power support in relation to device feature utilization.

DETAILED DESCRIPTION OF SPECIFIC EMBODIMENTS

One or more specific embodiments of the present disclosure will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. The techniques presented and claimed herein are referenced and applied to material objects and concrete examples of a practical nature that demonstrably improve the present technical field and, as such, are not abstract, intangible or purely theoretical.

As mentioned above, if the size of an IC package remains unchanged, adding a greater number of power and ground balls to enhance power supply needs to be compensated by reducing the number of I/O balls. However, a reduction in the number of I/O balls may mean a trade-off in computing capability and feature utilization of an electronic device. In addition, heat developed during the operation of ICs needs to be dissipated as to maintain the performance of the electronic device. Embodiments of the present disclosure relate to providing a thermoelectric power feedback system that recycles heat (e.g., waste heat) dissipated from ICs to generate additional electricity to power the ICs and/or any other power-hungry components in an IC package. As such, the thermoelectric power feedback system not only helps remove heat from the IC package, but also generates additional power to aid power supply to the IC package. With the additional power generated from waste heat, the IC package may include a fewer number of power and ground balls, and the space (e.g., chip real estate) saved from the reduction in the number of power and ground balls may be used to add more I/O balls such that the power support and feature utilization of the electronic device may be enhanced without increasing the size of the IC package.

Figure 1:
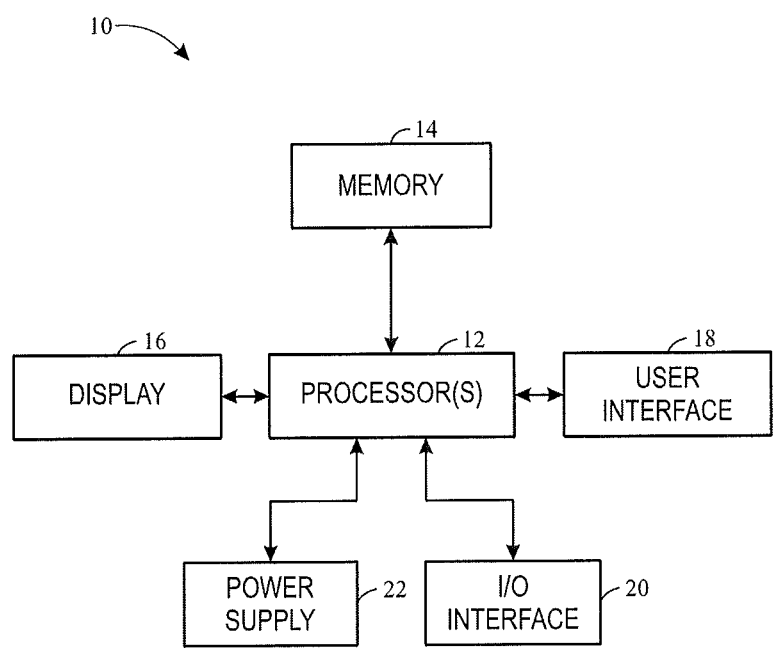
FIG. 1 is a block diagram of an electronic device in which one or more thermoelectric power feedback systems may be used to aid power supply, in accordance with an embodiment.

With the foregoing in mind, FIG. 1 shows a block diagram of an electronic device 10 that may integrate one or more thermoelectric power feedback systems as to aid power supply. The electronic device 10 according to an embodiment of the present disclosure may include, among other things, one or more processor(s) 12, a memory 14, a display 16, a user interface (UI) 18, an input/output (I/O) interface 20, and a power supply 22. The various functional blocks shown in FIG. 1 may include hardware elements (including circuitry), software elements (including computer code stored on a computer-readable medium) or a combination of both hardware and software elements.

The processor(s) 12 may include one or more application specific integrated circuits (ASICs), one or more field programmable gate arrays (FPGAs), one or more programmable circuits, one or more system-on-chip (SoC) circuits, one or more system-on-package (SoP) circuits, one or more system-in-chip (SiP) circuits, one or more general purpose processors, or any combination thereof. The memory 14 may include volatile memory, such as random access memory (RAM), and/or non-volatile memory, such as read-only memory (ROM), optical drives, hard disc drives, or solid-state drives. The memory 14 may store data or information and one or more sets of instructions (e.g., processor-executable instructions) implemented to enable operation of the electronic device 10. The display 16 may include one or more organic light emitting diode (OLED) displays, one or more liquid crystal display (LCD) panels, one or more active-matrix organic light emitting diode (AMOLED) displays, or any other one or more output devices to present information in visual form to users. The user interface (UI) 18 may include one or more graphical user interfaces, one or more touch screens, one or more command line interfaces, or any other types of interfaces to allow users to interact with the electronic device 10. The I/O interface 20 may enable the electronic device 10 to interface with various other electronic devices. The power supply 22 may be one or more batteries (e.g., rechargeable batteries) or a power supply unit (PSUs) that converts a general-purpose alternating current (AC) electric power supply to low-voltage regulated direct-current (DC) power for various elements of the electronic devices 10. It should be noted that the various elements (e.g., hardware and/or software elements) shown in FIG. 1 may include ICs (e.g., one or more IC chips, one or more IC packages) to enable the various elements to perform their functions. Within the one or more IC packages, one or more thermoelectric power feedback systems may be implemented to enhance power and feature utilization of the electronic device 10.

Figure 2:
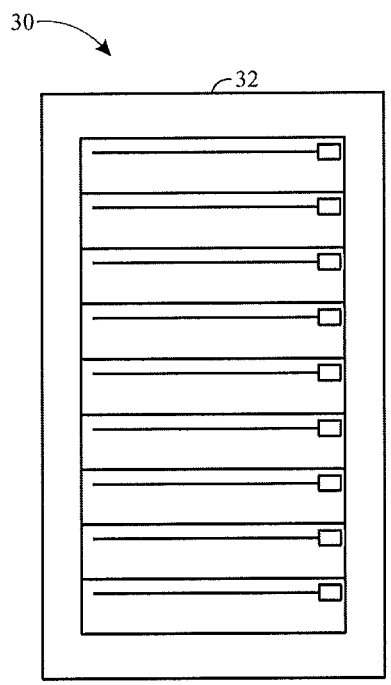
FIG. 2 is a perspective view of a server representing an embodiment of the electronic device of FIG. 1, in accordance with an embodiment.

It should also be noted that FIG. 1 is merely one example of a particular implementation and is intended to illustrate the types of components that may be present in the electronic device 10. Further, the electronic device 10 may represent a server 30 depicted in FIG. 2 or any other type of electronic device that might benefit from the present technique, such as a handheld electronic device, a wearable electronic device, or similar devices. The depicted server 30 may include a housing or enclosure 32, as well as one or more of the elements described in FIG. 1. The server 30 may be an application server, a catalog server, a communications server, a computing server, a database server, a game server, a media server, a web server, and any other type of server. The server 30 may rely on one or more IC packages to enable various applications and features. Within the one or more IC packages, one or more thermoelectric power feedback systems may be implemented as to enhance power supply and feature utilization of the server 30.

A thermoelectric power feedback system 58 may be implemented in one or more IC packages 60 used in the electronic device 10 shown in FIG. 1. The one or more IC packages 60 may be system-on-chip (SoC), system-on-package (SoP), system-in-package (SiP), power ICs, etc. FIGS. 3-6 each shows a schematic diagram of a thermoelectric power feedback system 58 implemented in an IC package 60 in accordance with an embodiment. In the illustrated embodiments, the IC package 60 includes one or more IC chips 62 and a substrate 64. In the following descriptions, a direction 63 pointing away from the chip 62 and toward the substrate 64 is referred to as the "bottom," whereas a direction 65 pointing away from the substrate 64 and toward the chip 62 is referred to as the "top." The IC chip 62 is coupled and electrically connected to the substrate 64 through a plurality of conductive contacts 66 within a bonding area 68. For example, the plurality of contacts 66 may be solder spheres, coupled to contact pads (not shown) on the IC chip 62, to facilitate electrical connections between a bottom surface 70 of the IC chip 62 and the corresponding contact pads (not shown) disposed at a top surface 74 of the substrate 64.

It may be appreciated that since the plurality of contacts 66 may be be densely distributed on the bottom surface 70 of the IC chip 62, it may not be convenient to bond such contacts 66 to a PCB or motherboard, hence, the substrate 64 may spread out the densely packed contacts 66 to a less dense spacing such that the I/O signals and power and ground contacts may be connected to the PCB. For example, the IC package 60 may include a plurality of conductive contacts such as balls (e.g., solder balls) 76 to couple and electrically connect a bottom surface 78 of the substrate 64 to the PCB. The plurality of balls 76 includes a plurality of I/O balls 80 for signal input/output and a plurality of power balls 82 and ground balls 84 for supplying power to the IC chip 62. Each of the plurality of contacts 66 is electrically connected to a corresponding one of the plurality of balls 76 (e.g., through the contact pads and through one or more electrical vias through the substrate 64). While the ratio of the I/O balls 80 to power balls 82 to ground balls 84 may change to meet certain design requirements of the IC package 60 (e.g., to reduce the package production cost, improve device performance, and reduce signal noise, etc.), the total number of the plurality of balls 76 may not be changed due to area constraint of the IC package 60 (e.g., limited chip real estate). For example, if the IC package size remains unchanged, adding a greater number of power and/or ground balls needs to be compensated by reducing the number of I/O balls, and vice versa.

Figure 3:
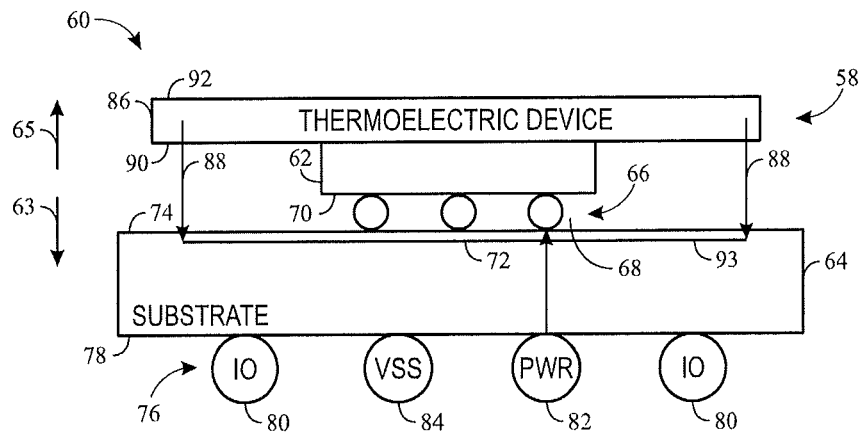
FIG. 3 is a schematic diagram of an IC package of the electronic device of FIG. 1 illustrating the thermoelectric power feedback system implemented in the IC package, wherein power is generated via a thermoelectric device, in accordance with an embodiment.

In the illustrated embodiments in FIGS. 3-6, the IC package 60 also includes the thermoelectric power feedback system 58 to enhance power supply by generating additional power based on heat generated by the IC chip 62 (e.g., recycling waste heat). In particular, the thermoelectric feedback system 58 includes one or more thermoelectric devices 86 coupled to the IC chip 62 and a power routing system 88 (e.g., bonding wires made of electrical conductive metal and/or metal alloys) to supply generated additional power to the IC chip 62 and/or other power demanding components, among other things, in the IC package 60. The thermoelectric device 86 includes a bottom side 90 and a top side 92, opposite to the bottom side 90 (e.g., in the direction 65), wherein the bottom side 90 directly contacts the IC chip 62, and the temperature at the bottom side 90 is higher than the temperature at the top side 92. Based on such temperature difference between the bottom side 90 and the top sides 92, the thermoelectric device 86 may generate electricity and at the same time remove at least a portion of the heat generated by the IC chip 62, as will be discussed in detail in FIG. 7. As such, additional power may be generated by the thermoelectric power feedback system 58 to aid power supply to the IC package 60. It may also be appreciated that implementation of the thermoelectric power feedback system 58 may also enhance thermal management of the IC package (e.g., removing heat form the IC chip 62) as to main the functionality of the electronic device 10. In one embodiment, as shown in FIG. 3, the power routing system 88 (e.g., bonding wires made of electrical conductive metal and/or metal alloys) of the thermoelectric power feedback system 58 may couple to a power grid 93 of the IC package 60 such that the generated additional power may be directly fed to power the IC package 60 including the IC chip 62.

Figure 4:
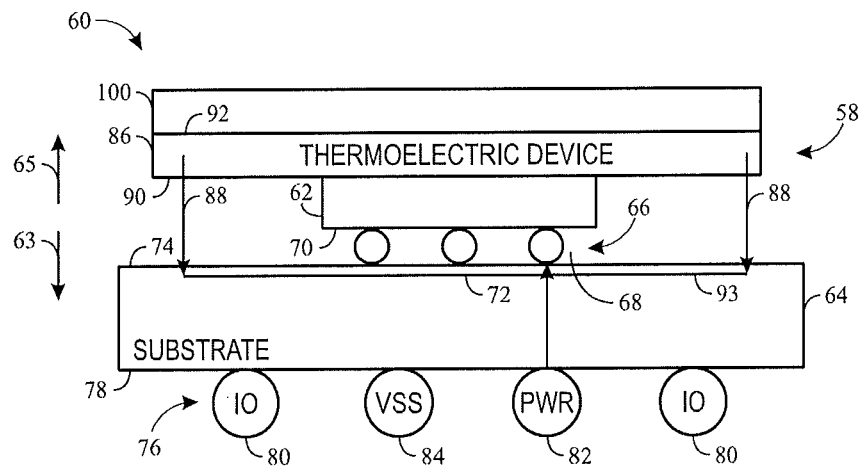
FIG. 4 is a schematic diagram of an integrated circuit (IC) package of the electronic device of FIG. 1 illustrating the thermoelectric power feedback system implemented in conjunction with a heat sink in the IC package, in accordance with an embodiment.

In one embodiment, as shown in FIG. 4, the thermoelectric device 86 of the thermoelectric power feedback system 58 is used in conjunction with one or more heat removing components such as a heat sink 100 to dissipate heat generated by the IC chip 62. The thermoelectric device 86 is coupled to both the IC chip 62 and the heat sink 100 such that the bottom side 90 directly contacts the chip 62 and the top side 92 directly contacts the heat sink 100. As such, residual heat or heat that is not recycled or utilized by the thermoelectric device 86 may be dissipated by the heat sink 100. It may be appreciated that the one or more heat removing component may not be limited to a passive cooling component such as the heat sink 100, and may include any other passive or active cooling devices such as closed-loop microfluidic cooling devices, cooing fins, cooling cavities, cold plates, air cooling devices, etc.

Figure 5:
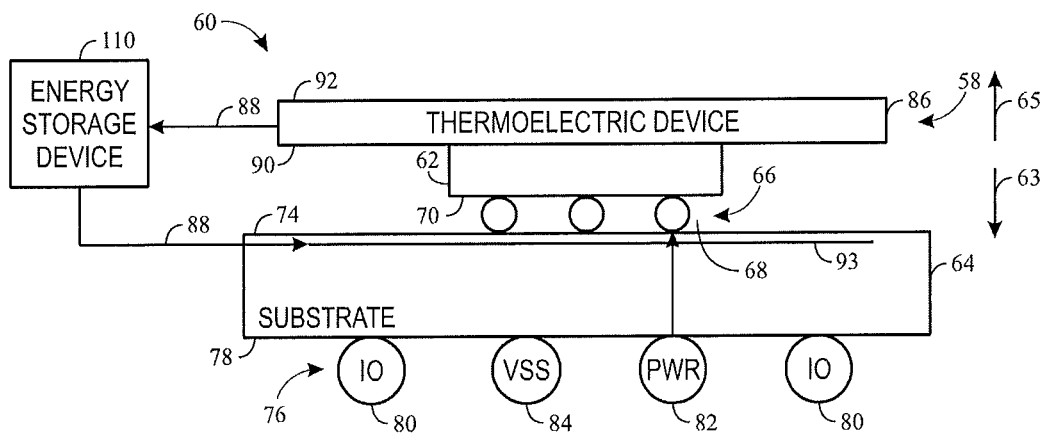
FIG. 5 is a schematic diagram of an integrated circuit (IC) package of the electronic device of FIG. 1 illustrating the thermoelectric power feedback system coupled to an energy storage device to store generated power, in accordance with an embodiment.

In one embodiment, as shown in FIG. 5, the power routing system 88 (e.g., bonding wires made of electrical conductive metal and/or metal alloys) may include an energy storage device 110 such as a battery, a capacitor, or a combination thereof, and the energy storage device 110 is coupled to both the thermoelectric device 86 and the power grid 93. As such, the generated power by the thermoelectric device 86 may be stored in the energy storage device 110 and upon a demand fed to the IC chip 62 and/or other power demanding components, among other things, of the IC package 60.

In one embodiment, as shown in FIG. 6, the thermoelectric power feedback system 58 includes a plurality of thermoelectric devices 86 adjacent to one another to enhance the power generating efficiency. The plurality of thermoelectric devices 86 includes a first thermoelectric device 120, a second thermoelectric device 122, and a third thermoelectric device 124 stacked on top of the IC chip 62 in the direction 65. The first thermoelectric device 120 contacts the IC chip 62, the second thermoelectric device 122 contacts the first and the third thermoelectric devices 120 and 124, and the third thermoelectric device 124 contacts the second thermoelectric device 122. The first thermoelectric device 120 may recycle heat generated by the IC chip 62 to generate power, the second thermoelectric device 122 may recycle residual heat (e.g., heat that is not recycled by the first thermoelectric device 120) to generate power, and the third thermoelectric device 124 may still recycle residual heat (e.g., heat that is not recycled by the first and second thermoelectric devices 120 and 122) to generate power.

As such, in cases that a single thermoelectric device (e.g., the first thermoelectric device 120) is not able to recycle all of the heat generated by the IC chip 62, the residual heat may be recycled by additional thermoelectric devices (e.g., the second thermoelectric device 122, the third thermoelectric device 124, and so on) as to enhance efficiency or power generating efficiency of the thermoelectric power feedback system 58. Herein the efficiency of the thermoelectric power feedback system 58 is defined as electrical energy generated or power generated for one hour divided by heat energy absorbed at the thermoelectric device(s) 86. For example, if the plurality of thermoelectric devices 86 each has an efficiency of approximately 10% (e.g., approximately 10% of heat energy absorbed at the thermoelectric device 86 is converged to electrical energy), having the first, second, and third thermoelectric devices 120, 122, and 124 stacked together may achieve approximately 27.1% efficiency (e.g., 100%−(100%−10%)×(100%−10%)×(100%−10%)=27.1%) as compared to an approximately 10% efficiency if only one thermoelectric device is used.

Although in the illustrated embodiment the plurality of thermoelectric devices 86 includes only three thermoelectric devices, any number of thermoelectric devices 86 may be incorporated and arranged in any configurations suitable to recycle heat generated by the IC chip 62 and to generate power. Further, it may be appreciated that the efficiency of the thermoelectric power feedback system 58 may generally increase with the number of thermoelectric devices 86. The generated power may be fed back to power the chip 62 and/or other power demanding components, among other things, through the power routing system 88 (e.g., bonding wires made of electrical conductive metal and/or metal alloys) connected to the power grid 93 of the IC package 60. In addition, thermoelectric device(s) 86 and the power routing system 88 may be arranged in any combination set forth above in FIGS. 3-6.

FIG. 7 shows a schematic diagram of the thermoelectric device 86 of the thermoelectric power feedback system 58 illustrating a power generation mechanism. It should be noted that the thermoelectric device 86 may be any suitable thermoelectric generator that coverts thermal energy into electrical energy based on the thermoelectric effect. In particular, a difference in temperature is used to create an electric potential based on Seebeck effect (e.g., converting temperature difference to electrical current).

In the illustrated embodiment, the thermoelectric device 86 includes a thermoelement junction 140 coupled to a hot element or heat source 142 (e.g., element of higher temperature) at a first interface 144 and coupled to a cold element 146 (e.g., element of lower temperature) at a second interface 148. The hot element 142 discussed herein may refer to the IC chip 62, and the cold element 146 may refer to any components having a lower temperature than the IC chip 62, including the one or more heat removing components such as the heat sink 100. One or both of the first interface 144 and the second interface 148 may be electrically coupled (e.g., via wires made of electrical conductive metal and/or metal alloys) to the power routing system 88 of the thermoelectric power feedback system 58 such that electrical current generated by the thermoelectric device 86 may be flown to a load 150. The load 150 discussed herein may refer to any power demanding components in the IC package 60 as set forth above.

The thermoelement junction 140 may generate electrical energy based on a temperature difference between the hot element 142 and the cold element 146. In particular, the thermoelement junction 140 may include any suitable thermoelectric materials showing prominent Seebeck effect, such as bismuth telluride, lead telluride, silicon germanium, any other suitable semiconductors, or a combination thereof. Further, the thermoelectric materials may also be in any suitable forms, including alloys, complex crystals, and multiphase nanocomposites. In the illustrated embodiment, the thermoelement junction 140 includes an n-type semiconductor 152 coupled to a p-type semiconductor 154. In operation, providing a temperature difference across the thermoelement junction 140, the hot element 142 drives electrons in the n-type semiconductor 152 toward the cold element 146, creating a current. Correspondingly, holes in the positive element 154 flows in the direction of the electrical current, resulting in the current flow (e.g., as indicated by the arrows) in a closed circuit of the thermoelement junction 140. It may be appreciated that as long as a temperature difference is present, an electrical current can be generated within the thermoelement junction 140 flown to the power routing system 88 of the thermoelectric power feedback system 58.

FIG. 8 is a table 170 illustrating an enhanced power support based on implementation of the thermoelectric power feedback system 58 in the IC package 60. In the illustrated embodiment, the IC package 60 includes the thermoelectric power feedback system 58 to help aid power supply to the IC chip 62 for field-programmable gate arrays (FPGAs). In this example, the FPGAs may consume approximately 200 watts (W) of power, among which approximately 100 W is the core power consumed by logic elements (LE). The thermoelectric power feedback system 58 may include a thermoelectric device 86 having approximately 10% efficiency (e.g., approximately 10% of heat energy absorbed at the thermoelectric device 86 is converged to electrical energy). Accordingly, the thermoelectric device 86 may generate approximately 10% of the 200 W (e.g., 20 W) by recycling heat generated by the FPGA, and the generated power (e.g., 20 W) may be supplied to help powering the LE of the FPGA. In particular, the generated 20 W may be fed to the LE such that the new core power is allocated to approximately 120 W. In other words, the FPGA receives an approximately 20% power boost in the LE (e.g., increased from 100 W to 120 W).

In this example, it is also estimated that the FPGA may require approximately 30 power balls 82 to supply approximately 20 W of power to the chip 62. As such, with 20 W of additional power generated by the thermoelectric power feedback system 58, the IC package 60 may save or replace approximately 30 power balls 82 (along with approximately 30 corresponding ground balls 84) for other utilization. For example, the power and ground balls 80 and 82 may be replaced by I/O balls 80 to enhance signal input/output. As such, the power supply and feature utilization of the FPGA may be enhanced without increasing the size of the FPGA and without adding more power and ground balls 80 and 82. It should be noted that thermoelectric power feedback system 58 may include more than one thermoelectric devices 86 such that the power generating efficiency may increase and result in greater saving in the number of power balls 82 (and correspondingly ground balls 84). Such reduction in package power ball requirement may reduce the device manufacturing cost and enhance power support for higher feature utilization and power efficient applications.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. A system comprising:
   an electronic device comprising one or more integrated circuit (IC) packages, comprising:

one or more IC chips disposed on a substrate;
one or more thermoelectric power feedback systems, comprising:
one or more thermoelectric devices coupled to the one or more IC chips to generate power based on heat produced by the one or more IC chips; and
a power routing system configured to directly, electrically couple the one or more thermoelectric devices to a power grid disposed on the substrate such that the generated power is directly fed to the one or more IC chips; and
a plurality of conductive contacts configured to couple the one or more IC chips to a printed circuit board of the electronic device, wherein the plurality of conductive contacts comprises a plurality of power balls and a plurality of input/output (I/O) balls, wherein the power routing system is configured to supply the generated power to the one or more IC chips such that one or more of the plurality of conductive contacts that would otherwise be implemented as one or more power balls to supply a supply power equivalent to the generated power, are implemented as one or more I/O balls.

2. The system of claim 1, wherein the one or more IC packages comprise a plurality of ground balls that couple the one or more IC chips to the printed circuit board of the electronic device.

3. The system of claim 1, wherein the one or more thermoelectric power feedback systems each has a power generating efficiency of at least approximately 10%.

4. The system of claim 1 comprises a heat sink coupled to the one or more thermoelectric devices.

5. The system of claim 4, wherein the one or more thermoelectric devices are disposed between the heat sink and the one or more IC chips.

6. The system of claim 1, wherein the one or more thermoelectric devices comprise a plurality of thermoelectric devices stacked on one another.

7. The system of claim 6, wherein the one or more thermoelectric devices are stacked on one another in a direction away from the one or more IC chips.

8. The system of claim 1, wherein the power routing system comprises an energy storage device.

9. An integrated circuit (IC) package comprising:
a substrate;
one or more IC chips disposed on the substrate;
one or more thermoelectric power feedback systems, comprising:
one or more thermoelectric devices coupled to the one or more IC chips to generate power based on heat generated by the one or more IC chips, wherein the one or more thermoelectric devices comprises a plurality of thermoelectric devices vertically stacked on one another; and
a power routing system disposed on the substrate and configured to supply the generated power from the one or more thermoelectric devices directly to the IC package; and
a plurality of conductive contacts configured to couple the one or more IC chips to a printed circuit board of an electronic device, wherein the plurality of conductive contacts comprises a plurality of power balls and a plurality of input/output (I/O) balls, wherein the power routing system is configured to supply the generated power to the one or more IC chips such that one or more of the plurality of conductive contacts that would otherwise be implemented as one or more power balls to supply a supply power equivalent to the generated power, are implemented as one or more I/O balls.

10. The IC package of claim 9, wherein the one or more IC packages comprise a plurality of ground balls that provide electrical connection between the one or more IC chips and the electronic device.

11. The IC package of claim 9, wherein the one or more thermoelectric power feedback systems each has a power generating efficiency of at least approximately 10%.

12. The IC package of claim 9 comprises a heat sink coupled to the one or more thermoelectric devices.

13. The IC package of claim 12, wherein the one or more thermoelectric devices are disposed between the heat sink and the one or more IC chips.

14. The IC package of claim 9, wherein the power routing system comprises an energy storage device.

15. An integrated circuit (IC) package comprising:
one or more IC chips;
a plurality of conductive contacts comprising a first number of power balls, a second number of ground balls, and a third number of input/output (I/O) balls that provide electrical connection between the one or more IC chips and a printed circuit board of an electronic device; and
one or more thermoelectric power feedback systems that generate and supply electrical power to the IC package comprising:
one or more thermoelectric devices coupled to the one or more IC chips to generate the electrical power based on heat produced by the one or more IC chips; and
a power routing system that couples the one or more thermoelectric devices to a power grid of the IC package, wherein the power routing system supplies the generated electrical power to the power grid and to the one or more IC chips without routing the generated electrical power through a power ball of the first number of power balls, and wherein the power routing system is configured to supply the generated electrical power to the one or more IC chips such that one or more of the plurality of conductive contacts that would otherwise be implemented as one or more power balls to supply a supply power equivalent to the generated electrical power, are implemented as one or more I/O balls.

16. The IC package of claim 15, wherein the one or more thermoelectric power feedback systems each has a power generating efficiency of at least approximately 10%.

17. The IC package of claim 15, wherein the one or more thermoelectric devices comprise a number of thermoelectric devices stacked on one another as to increase a power generating efficiency of the one or more thermoelectric power feedback systems.

18. The IC package of claim 15 comprises a heat sink coupled to the one or more thermoelectric devices.

19. The IC package of claim 15 comprises an energy storage device.

* * * * *